United States Patent [19]
Shih et al.

[11] Patent Number: 5,874,320
[45] Date of Patent: Feb. 23, 1999

[54] METHOD FOR FORMING P-TYPE GALLIUM NITRIDE

[75] Inventors: Kwang-Kuo Shih; Chao-Nien Huang, both of Hsinchu Hsien; Chin-Yuan Chen; Biing-Jye Lee, both of Hsinchu; Ming-Huang Hong, Tainan, all of Taiwan

[73] Assignee: Industrial Technology Research Institute, Hsinchu, Taiwan

[21] Appl. No.: 893,385

[22] Filed: Jul. 11, 1997

[30] Foreign Application Priority Data

Mar. 20, 1997 [TW] Taiwan ................... 86103516

[51] Int. Cl.$^6$ ................................ H01L 21/22
[52] U.S. Cl. ..................... 438/46; 438/483; 438/796
[58] Field of Search ................. 438/45, 46, 509, 438/479, 481, 483, 796, 798, 909; 148/DIG. 3, DIG. 4, DIG. 65, DIG. 113

[56] References Cited

U.S. PATENT DOCUMENTS

| | | |
|---|---|---|
| 5,290,393 | 3/1994 | Nakamura . |
| 5,306,662 | 4/1994 | Nakamura et al. ............ 437/107 |
| 5,496,766 | 3/1996 | Amano et al. ................ 438/46 |
| 5,633,192 | 5/1997 | Moustakas et al. ............ 438/46 |
| 5,652,434 | 7/1997 | Nakamura et al. ............ 257/22 |
| 5,657,335 | 8/1997 | Rubin et al. ................ 372/46 |

Primary Examiner—John F. Niebling
Assistant Examiner—S. Mulpuri
Attorney, Agent, or Firm—Sughrue, Mion, Zinn, Macpeak & Seas, PLLC

[57] ABSTRACT

A method for forming P-type gallium nitride is disclosed in the invention. In this method, Mg—H can be completly discomposed by use of an annealing process, thereby entirely dissociating the hydrogen atoms from the gallium nitride, while the nitrogen atoms are not dissociated from the gallium nitride. Therefore, the P-type gallium nitride having high conductivity is obtained and $V_N$ gap defects created in the gallium nitride do not occur. During the annealing process, nitrogen flux is added around the gallium nitride to prevent decomposition of the gallium nitride. The above-mentioned nitrogen flux can be generated by use of RF plasma, electron cyclotron resonance (ECR) or ion beam. Furthermore, since a forward current is provided across the P—N junction of the gallium nitride, the Mg—H inside the magnesium-doped gallium nitride can be decomposed by just increasing the temperature to 175° C. Therefore, in the invention, when a diode structure is manufactured with gallium nitride, the hydrogen atoms can be dissociated from the gallium nitride in a low-temperature process, thereby activating the magnesium (acceptor), such that the conductivity of the P-type gallium nitride is further increased and $V_N$ gap defects caused by a high-temperature process are prevented.

4 Claims, No Drawings

METHOD FOR FORMING P-TYPE GALLIUM NITRIDE

BACKGROUND OF THE INVENTION

1. Field of the Invention

The invention relates to a method for forming a P-type gallium nitride.

2. Description of the Related Art

Currently, in all materials used for manufacturing luminescent devices which can emit blue, purple or ultraviolet light rays, gallium nitride has the best potential, because the gallium nitride has a direct energy gap structure and its energy gap is about 3.39 eV at a room temperature. In the prior art, a hetero-epitaxial growing process performed on a sapphire substrate is used to form single-crystal gallium nitride. However, since there are great differences between the gallium nitride and sapphire substrate in lattice match and coefficient of thermal expansion, it is very difficult to grow gallium nitride of high quality and high planarization. Nevertheless, this problem can be overcome by depositing an AlN layer to function as a buffer layer on the sapphire substrate before the gallium nitride is grown. Therefore, the planarization, crystal quality and electric properties of the gallium nitride layer can be improved.

In order to further improve the efficiency of an LED which emits blue light, and manufacture an LED with gallium nitride, development and research of P-type gallium nitride is urgently necessary. Growing gallium nitride doped with magnesium (Mg) is disclosed in Jpn. J. Appl. Phys. Vol. 28, No. 12, Dec. 1989, pp. L2112–L2114 by Hiroshi Amano, et al., wherein a low-energy electron beam process is performed after the magnesium-doped gallium nitride is grown, so that the formed magnesium-doped gallium nitride has a hole concentration on the order of $2 \times 10^{16} cm^{-3}$, a hole mobility on the order of $8 cm^2/Vxs$, and a resistivity on the order of 35 $\Omega \times cm$. However, P-type gallium nitride having the above-mentioned data can not be sufficiently utilized to manufacture a blue light ray-emitting and high power LED. To resolve this problem, annealing magnesium-doped gallium nitride at a temperature on the order of 700° C. is disclosed in Jpn. J. Appl. Phys. Vol. 31 (1992), Pt. 2, No. 2B, pp. L139–L142 by Shuji Nakamura et al., wherein hydrogen can be dissociated from the Mg—H to activate the magnesium (acceptor), such that the formed P-type gallium nitride has a low impedance, and wherein this P-type gallium nitride has a resistivity on the order of 2 $\Omega \times cm$, a hole concentration on the order of $3 \times 10^{17} cm^{-3}$, and a hole mobility on the order of 10 $cm^2/V$-s.

Generally, the annealing temperature should be kept in a range of 700°~800° C. If the temperature is below 700° C., the Mg—H is not easily decomposed completely. Furthermore, if the hydrogen atoms can not be completely dissociated from the gallium nitride, once the temperature is lowered, the dissociated hydrogen atoms can combine with the magnesium into Mg—H immediately. As a result, the magnesium can not be activated and the resistance is increased. On the other hand, if the temperature is higher than 700°C., the nitrogen atoms inside the gallium nitride are dissociated, resulting in $V_N$ gap defects.

SUMMARY OF THE INVENTION

In view of the above, the object of the invention is to provide a method for forming P-type gallium nitride. In this method, the Mg—H can be completely decomposed by the use of an annealing process and thereby the hydrogen atoms can be completely dissociated from the gallium nitride, and the nitrogen atoms are not dissociated from the gallium nitride. Therefore, the P-type gallium nitride having high conductivity is obtained and the defects of $V_N$ gaps created in the gallium nitride can be prevented.

First, gallium nitride is doped with magnesium, then the magnesium-doped gallium nitride is annealed according to the invention. Furthermore, during the annealing process, nitrogen flux is added around the gallium nitride to prevent decomposition of the gallium nitride. The above-mentioned nitrogen flux can be generated by the use of RF plasma, electron cyclotron resonance (ECR) or ion beam, such that the hydrogen can be dissociated from the Mg—H inside the gallium nitride, resulting in activation of the magnesium (acceptor). Therefore, the formed P-type gallium nitride can have high conductivity. Meanwhile, since a substantial quantity of nitrogen flux surrounds the gallium nitride, the gallium nitride can be prevented from high temperature decomposition that causes $V_N$ gap defects.

In addition, if the magnesium-doped gallium nitride is grown on N-type gallium nitride, after the P-type gallium nitride is formed by doping the gallium nitride with the magnesium, the Mg—H inside the magnesium-doped gallium nitride can be decomposed by just increasing the temperature to 175° C., due to a forward current existing on the P—N junction between the P-type gallium nitride and N-type gallium nitride. Therefore, in the invention, when a diode structure is manufactured by the gallium nitride, the hydrogen atoms can be dissociated from the gallium nitride in a low-temperature process, thereby activating the magnesium (acceptor), so that the conductivity of the P-type gallium nitride is further increased and $V_N$ gap defects caused by a high-temperature process can be prevented.

DETAILED DESCRIPTION OF THE INVENTION

Embodiment 1

A method for forming P-type gallium nitride having high conductivity and low defects according to a first embodiment of the invention comprises the following steps: (1) gallium nitride is doped with magnesium to form P-type gallium nitride by use of metal organic chemical vapor deposition (MOCVD) until its concentration is on the order of $10^{20}$~$10^{21} cm^{-3}$; and (2) the magnesium-doped gallium nitride is annealed at a temperature of 700°~900° C. for 20~60 mins, wherein a substantial quantity of nitrogen flux is provided and surrounds the gallium nitride, thereby dissociating the hydrogen from the Mg—H inside the magnesium-doped gallium nitride.

As a result, the P-type gallium nitride formed according to the first embodiment has high conductivity, a hole concentration of more than $10^{18} cm^{-3}$, a hole mobility of 5~10 $cm^2/V$-s, and a resistivity of about 0.1$\Omega \times cm$.

Embodiment 2

A method for forming P-type gallium nitride having high conductivity and low defects according to a second embodiment of the invention comprises the following steps: (1) gallium nitride is doped with magnesium to form P-type gallium nitride by use of metal organic chemical vapor deposition (MOCVD) until its concentration is on the order of $10^{20}$~$10^{21}$ $cm^{-3}$, wherein the magnesium-doped gallium nitride is formed on N-type gallium nitride; (2) then the magnesium-doped gallium nitride is annealed at a temperature of 700°~900° C. for 20~60 mins, wherein a substantial quantity of nitrogen flux is provided that surrounds the gallium nitride, thereby dissociating the hydrogen from the Mg—H inside the magnesium-doped gallium nitride; and (3) since a P—N junction exists between the P-type gallium nitride and N-type gallium nitride after the high-temperature process, the hydrogen inside the Mg—H is further dissociated at a low-temperature of about 200° C. by providing a forward bias on the P—N junction to create a current of about 10 mA.

After the above-mentioned steps, since part of the hydrogen inside the Mg—H is dissociated at a high-temperature and then the remaining hydrogen atoms are completely dissociated out of the gallium nitride at a low-temperature by providing an external forward bias to ensure the magnesium ions inside the P-type gallium nitride are activated, a P-type gallium nitride to high quality and high conductivity can be obtained. Moreover, the P-type gallium nitride formed according to the invention has a resistivity of just about 0.1 Ω×cm which is at least one order less than the resistivity of conventional P-type gallium nitride, which is on the order of 2 Ω×cm. Consequently, the conductivity of the P-type gallium nitride according to the invention can be greatly increased. Meanwhile, $V_N$ gap defects can also be prevented at a low-temperature of about 200° C. by providing an external forward bias.

Furthermore, the above-described nitrogen flux can be created by use of RF plasma, electron cyclotron resonance or ion beam. As for the procedures for these methods, refer to Jpn. J. Appl. Phys. Vol. 34 (1995) Pt. 1, No. 2B, pp. 1153–1158 which discusses "growing gallium nitride by RF plasma using nitrogen as a source", disclosed by Akihiko Kikuchi et al., Journal of Electronic Materials, Vol. 24, No. 4, 1995, pp. 275–281 which discusses "electron cyclotron resonance", disclosed by R. J. Molnar et al., and MRS BULLETIN, Feb., 16/Mar. 16, 1987, pp. 40–49 which discusses "ion beam secondary deposition", disclosed by S. M. Rossnagel et al.

What is claimed is:

1. A method for forming P-type gallium nitride on N-type gallium nitride, comprising:

(a) doping undoped gallium nitride with magnesium;

(b) annealing the gallium nitride of step a, while surrounding with a substantial quantity of nitrogen flux; and (c) providing a forward bias which creates a forward current across a P—N junction between P-type gallium nitride and N-type gallium nitride formed in step b, then heat treating at a temperature lower than the temperature used for said annealing.

2. A method as claimed in claim 1, wherein said forward current is about 10 mA.

3. A method as claimed in claim 1, wherein the temperature of said heat treating is about 200° C.

4. A method as claimed in claim 1, wherein the temperature during said annealing process in step (b) is controlled in a range of 700°~900° C. for about 20~60 mins.

* * * * *